United States Patent
Subramanian et al.

(10) Patent No.: US 9,128,710 B2
(45) Date of Patent: Sep. 8, 2015

(54) POWER SAVING TECHNIQUES THAT USE A LOWER BOUND ON BIT ERRORS

(71) Applicant: SK hynik memory solutions inc., San Jose, CA (US)

(72) Inventors: Arunkumar Subramanian, San Jose, CA (US); Frederick K. H. Lee, Mountain View, CA (US); Jason Bellorado, San Jose, CA (US); Xiangyu Tang, San Jose, CA (US); Lingqi Zeng, Turlock, CA (US)

(73) Assignee: SK hynix memory solutions inc., San Jose, CA (US)

(*) Notice: Subject to any disclaimer, the term of this patent is extended or adjusted under 35 U.S.C. 154(b) by 151 days.

(21) Appl. No.: 13/902,410

(22) Filed: May 24, 2013

(65) Prior Publication Data

US 2014/0013166 A1 Jan. 9, 2014

Related U.S. Application Data

(60) Provisional application No. 61/655,817, filed on Jun. 5, 2012.

(51) Int. Cl.
*G06F 1/32* (2006.01)
*G11C 7/00* (2006.01)

(52) U.S. Cl.
CPC ............... *G06F 1/3206* (2013.01); *G06F 1/32* (2013.01); *G06F 1/3225* (2013.01); *G06F 1/3234* (2013.01); *G06F 1/3275* (2013.01); *G06F 1/3287* (2013.01); *G11C 7/00* (2013.01); *Y02B 60/1225* (2013.01); *Y02B 60/1228* (2013.01)

(58) Field of Classification Search
CPC ..... G06F 1/3206; G06F 1/3234; G06F 1/3225; G06F 1/32; G06F 1/3287; Y02B 60/1225; G11C 7/00
USPC ......... 714/774, 773, 752, 786, 799, 763, 751, 714/704, 47.2; 365/185.24, 200, 201, 227, 365/185.33; 711/104
See application file for complete search history.

(56) References Cited

U.S. PATENT DOCUMENTS

| | | | | |
|---|---|---|---|---|
| 6,501,682 B2* | 12/2002 | Yoshida | ................... | 365/185.22 |
| 6,661,709 B2* | 12/2003 | Yoshida | ................... | 365/185.22 |
| 8,351,288 B2* | 1/2013 | Tsai et al. | ..................... | 365/211 |
| 2002/0021583 A1* | 2/2002 | Yoshida | ................... | 365/185.22 |
| 2008/0126686 A1* | 5/2008 | Sokolov et al. | ................ | 711/103 |
| 2011/0185224 A1* | 7/2011 | Tsai et al. | ..................... | 714/6.11 |
| 2011/0289385 A1* | 11/2011 | Takeuchi et al. | ............. | 714/764 |
| 2012/0198308 A1* | 8/2012 | Varnica et al. | ................ | 714/760 |
| 2013/0132806 A1* | 5/2013 | Vummintala et al. | ......... | 714/800 |

* cited by examiner

*Primary Examiner* — John J Tabone, Jr.
(74) *Attorney, Agent, or Firm* — Van Pelt, Yi & James LLP

(57) ABSTRACT

A read back bit sequence and charge constraint information are obtained. A lower bound on a number of bit errors associated with the read back bit sequence is determined based at least in part on the read back bit sequence and the charge constraint information. The lower bound and an error correction capability threshold associated with an error correction decoder are compared. In the event the lower bound is greater than or equal to the error correction capability threshold, an error correction decoding failure is predicted and in response to the prediction a component is configured to save power.

20 Claims, 9 Drawing Sheets

POWER SAVING TECHNIQUES THAT USE A LOWER BOUND ON BIT ERRORS

CROSS REFERENCE TO OTHER APPLICATIONS

This application claims priority to U.S. Provisional Patent Application No. 61/655,817 entitled BOUNDING THE BIT-ERRORS AND EARLY DECODER TERMINATION FOR CHARGE-CONSTRAINED OR CHARGE-KNOWN DATA-SEQUENCES IN NAND FLASH STORAGE DEVICES filed Jun. 5, 2012 which is incorporated herein by reference for all purposes.

BACKGROUND OF THE INVENTION

Solid state storage, such as NAND Flash storage, is often used in mobile devices. In mobile systems it is important to conserve power, since a battery provides a limited or finite amount of power. New solid state storage controllers which are able to conserve power would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
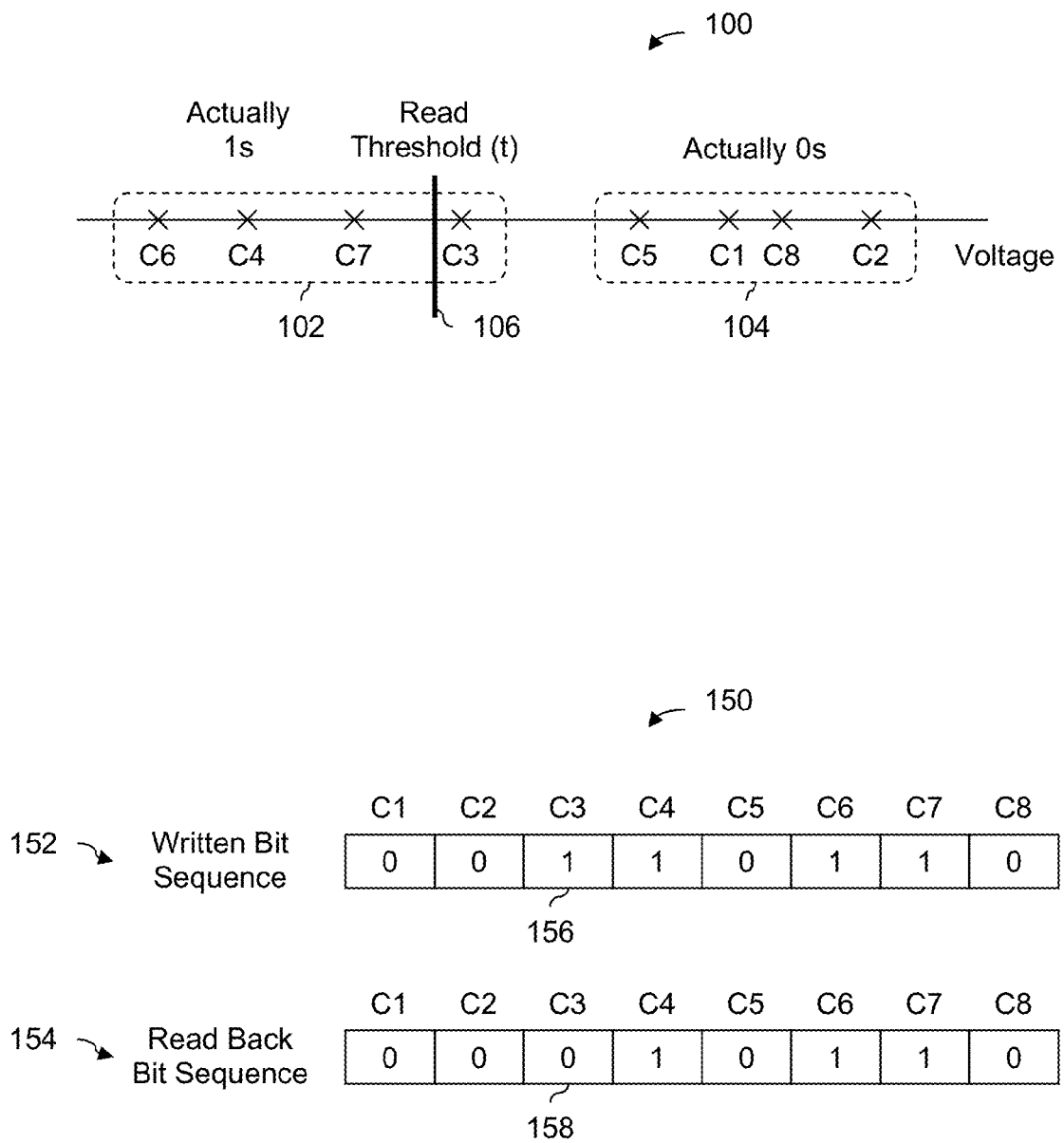
FIG. 1 is a diagram showing an embodiment of voltage levels stored by a group of cells in solid state storage.

FIG. 1 is a diagram showing an embodiment of voltage levels stored by a group of cells in solid state storage. In the example shown, there are 8 cells: C1-C8. The voltages stored by the cells are shown in diagram 100 in ascending order. Group 102 (comprising of cells C3-C4 and C6-C7) were written with a 1. As such, regardless of what value is read back, those cells actually store a 1. Group 104 (comprising cells C1-C2, C5, and C8) were written with a 0 and thus actually store 0s regardless of what value is actually read back. Diagram 150 shows the written bit sequence (i.e., [0 0 1 1 0 1 1 0]) which is written to cells C1-C8.

To read the cells, a read threshold (t) is selected. In diagram 100, the exemplary read threshold (106) has a voltage which is between the voltages stored by cell C7 and C3. Cells which have a voltage less than the read threshold are interpreted or read as a 1 and cells which have a voltage greater than the read threshold are interpreted or read as a 0. With the example read threshold 106 shown in diagram 100, diagram 154 shows the bit sequence read back from cells C1-C8. Note that the read back value for cell C3 (158) is a 0 but the written value (156) is a 1 and thus C3 has been read incorrectly. The number of bit errors in read back bit sequence 154 is thus 1 (i.e., cell C3).

The charge of a written bit sequence is defined to be $$C_W = \frac{N_1 - N_0}{2}$$

where $N_1$ is the (e.g., actual or written) number of 1s in the written bit sequence and $N_0$ is the (e.g., actual or written) number of 0s in the written bit sequence. To put it another way, a charge is the number of excess 1s with respect to a balanced sequence (e.g., a sequence with $C_W=0$). (Naturally, a charge may alternatively be defined as the number of excess 0s and the technique described herein also works when a charge is defined to be an excess number of 0s.) For written bit sequence 152, the charge is $$C_W = \frac{4-4}{2} = 0.$$

For a read back bit sequence, the number of 1s read back and number of 0s read back are a function of the read threshold, t. As a result, the charge of a read back bit sequence is a function of t:

$$C(t) = \frac{N_1(t) - N_0(t)}{2} \quad (1)$$

where t is the read threshold, $N_1(t)$ is the number of 1s read back using the read threshold t, and $N_0(t)$ is the number of 0s read back using the read threshold t.

In some embodiments described below, a read processor (not shown in this figure) knows the charge of a written bit sequence which has been charge constrained. For example, this may be because the write processor also stores the charge when the written bit sequence is stored (where the charge is guaranteed to fall within certain limits or bounds), and a read processor (not shown in this figure) accessed the stored charge. Or, the write processor may be configured to always output written bit sequences with the same charge (e.g., which falls within a certain bound or satisfies some limit). This type of system is referred to herein as a known charge constraint system.

In some embodiments described below, a read processor does not know the exact charge of a written bit sequence, but does know some range within which the charge is guaranteed to fall. For example, a write processor may be configured to output written bit sequences which have charges within a certain range. Although a corresponding read processor may not know the exact charge of a written bit sequence, the read processor will know the bound or range on the charge. This type of system is referred to herein as a bounded charge constraint system.

The following figures describe some embodiments in which a lower bound is used to predict if an error correction decoding process will fail and, if so, a component is configured to save power. For example, the component may be an iterative error correction decoder, such as a low-density parity check (LDPC) decoder, which is terminated early. Or, the component may be associated with an I/O bus between a NAND Flash controller and NAND Flash media (e.g., where the NAND Flash controller is a first semiconductor device (sometimes referred to as a "chip") and the NAND Flash media is a second semiconductor device).

Figure 2:
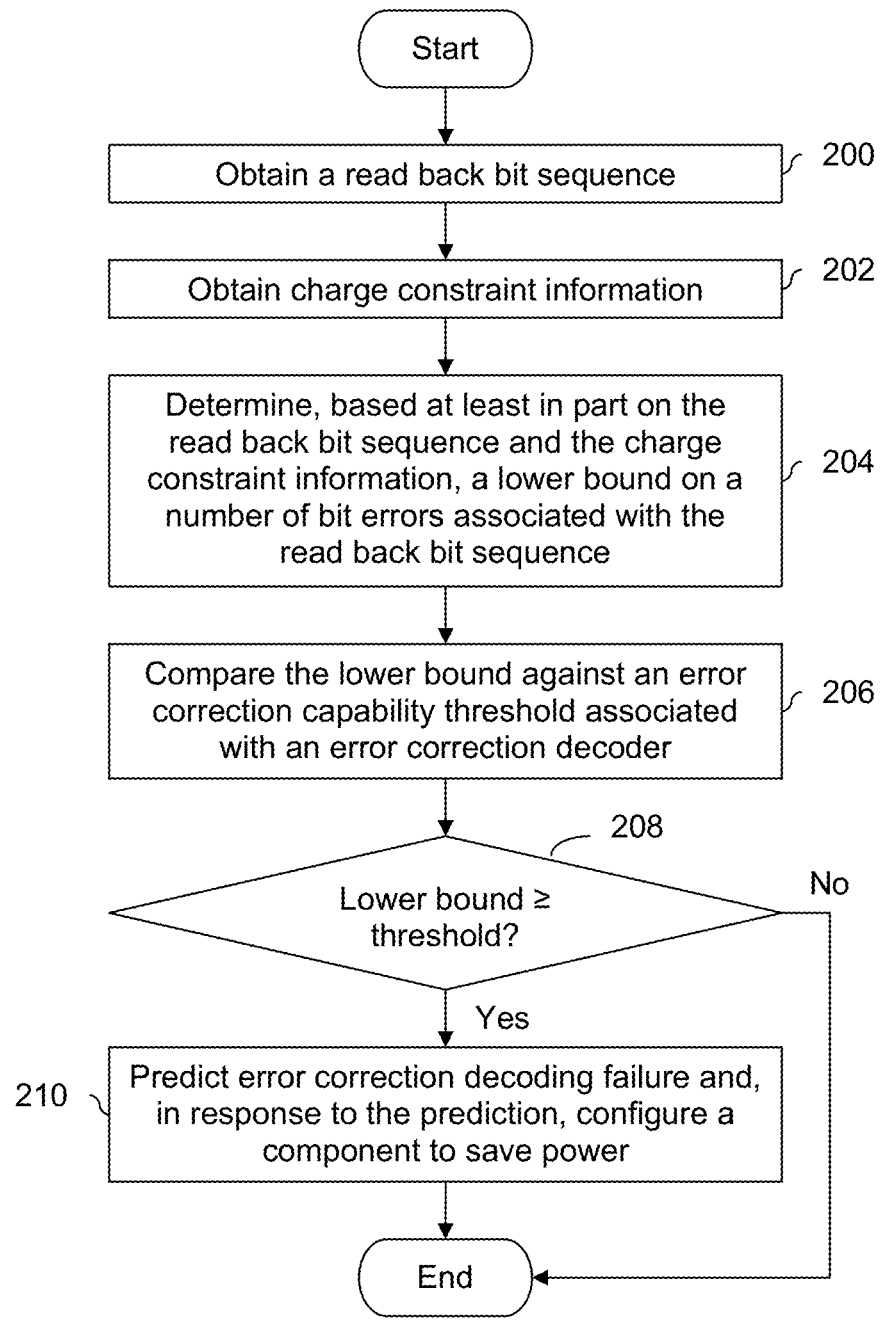
FIG. 2 is a flowchart illustrating an embodiment of a process for configuring a component to save power in response to an error correction decoding failure prediction.

FIG. 2 is a flowchart illustrating an embodiment of a process for configuring a component to save power in response to an error correction decoding failure prediction. In some embodiments, the process is performed by a read controller associated with a storage controller (e.g., a NAND Flash controller). In some embodiments, the process is performed by a semiconductor device, such as a field-programmable gate array (FPGA) or an application-specific integrated circuit (ASIC).

At 200, a read back bit sequence is obtained. In some embodiments, one or more complete or entire codewords are obtained at 200. In some embodiments, one or more segments in a codeword are obtained at 200 (e.g., where one or more ending segments in the codeword are not obtained and/or processed). In some embodiments, the length of a bit sequence obtained at 200 may depend on the size of an I/O bus between a storage controller and storage media. In one example, an I/O bus is 2,048 bits wide and a codeword is 4,096 bits long. The codeword in this example would be broken up into two "chunks" of 2,048 bits and 2 I/O transfers would be required.

At 202, charge constraint information is obtained. For example, in a known charge constraint system where the charge is stored, the charge of the written bit sequence is obtained from storage. Alternatively, in a bounded charge constraint system, the bound on the charge is obtained.

At 204, a lower bound on a number of bit errors associated with the read back bit sequence is determined based at least in part on the read back bit sequence and the charge constraint information. Another way to think of the lower bound is that there are at least that many actual bit errors, possibly more, in a read back bit sequence. For example, read back bit errors fall into two categories. A bit which is written as a 1 and is read back as a 0 is referred to as a type 0 error; a bit which is written as a 0 and is read back as a 1 is referred to as a type 1 error. The number of type 0 errors is $e_0(t)$ and the number of type 1 errors is $e_1(t)$, where the dependence of these errors on the read threshold is explicitly stated (i.e. $e_0$ and $e_1$ are functions of t). If the actual (i.e., written) number of 1s and 0s are $N_1$ and $N_0$, respectively, then Equation (1) may be re-written as:

$$C(t) = \left(\frac{N_1}{2} + |e_1(t)|\right) - \left(\frac{N_0}{2} + |e_0(t)|\right). \quad (2)$$

As described above, the charge of a written bit sequence is:

$$C_W = \frac{N_1 - N_0}{2} \quad (3)$$

which when inserted into Equation (2) becomes:

$$C(t) = C_W + |e_1(t)| - |e_0(t)|, \quad (4)$$

In a bounded charge constraint system, the charge is bounded by some known value (N):

$$-N \leq \frac{(N_1 - N_0)}{2} \leq N. \quad (5)$$

In order to use this property to find a lower bound for the actual number of bit errors, it is noted that the actual number of errors, e(t), can be broken up into the two underlying error types:

$$e(t) = |e_1(t)| + |e_0(t)| \quad (6)$$

and Equation (4) may be rewritten as:

$$C(t) - C_W = |e_1(t)| - |e_0(t)|. \quad (7)$$

If the absolute value of Equation (7) is taken, the following is the result:

$$|C(t) - C_W| = ||e_1(t)| - |e_0(t)||. \quad (8)$$

where the right side of Equation (8) can be upper bounded by the total number of bit-errors e(t), which produces the following inequality:

$$e(t) \geq ||e_1(t)| - |e_0(t)|| = |C(t) - C_W| = m(t). \quad (9)$$

In other words, m(t) is a lower bound on the actual number of bit errors e(t). Other examples of step 204 are described in further detail below.

Returning to FIG. 2, at 206, the lower bound is compared against an error correction capability threshold associated with an error correction decoder. Even if there is no intrinsic or native number of bit errors beyond which an error correction decoder is guaranteed to fail, an error correction capability threshold may be defined for which the error correction decoder has a high probability of failing. For example, iterative error correction decoders, such as low-density parity-check (LDPC) decoders, do not intrinsically or natively have an error correction capability radius. For such decoders, a threshold (beyond which decoding has a high probability of failing) may be determined or set for such decoders.

At 208, it is determined if the lower bound is greater than or equal to the threshold. If so, at 210 an error correction decoding failure is predicted and, in response to the prediction, a component is configured to save power. In some embodiments, the power savings comes from an iterative error correction decoder, such as an LDPC decoder, because a decoding process (which has already started) is terminated early (e.g., before a maximum number of decoding attempts is reached). Alternatively, decoding waits for the processing shown herein to complete and decoding is not initiated at 210, otherwise decoding is initiated. In some embodiments, the power savings comes from cancelling or not performing an I/O transfer (e.g., a read) between a storage controller and storage media.

Figure 3:
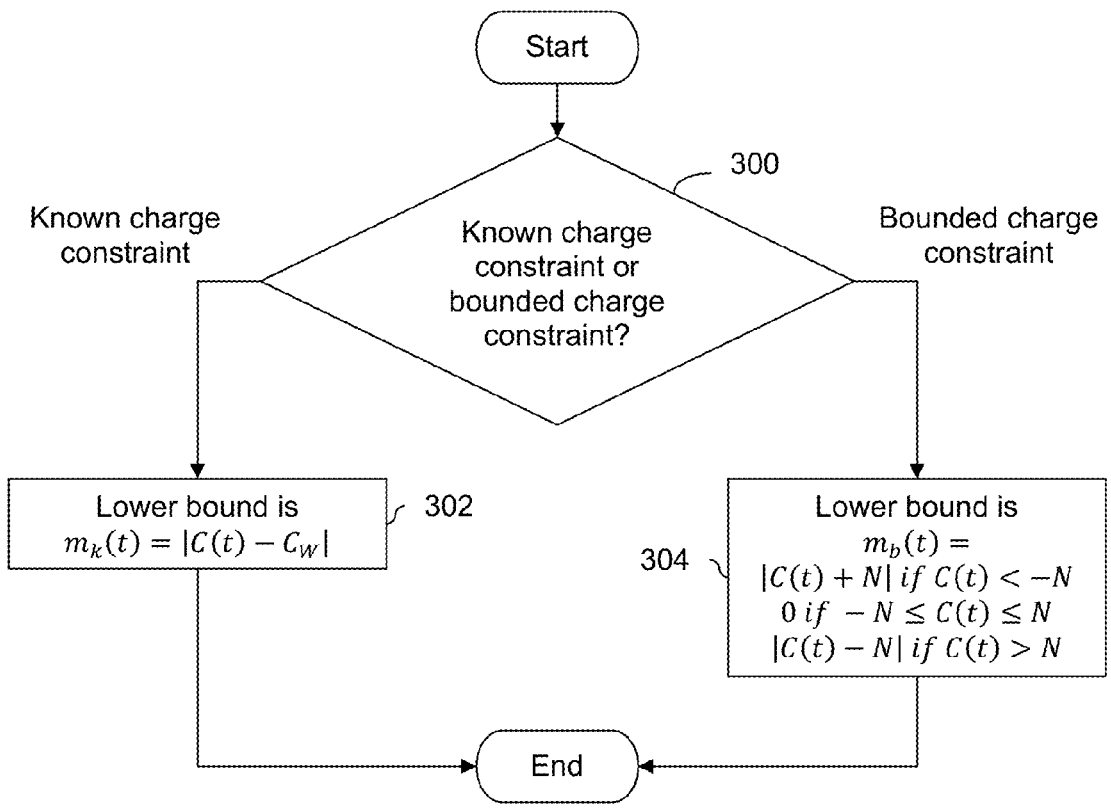
FIG. 3 is a flowchart illustrating an embodiment of process for determining a lower bound.

FIG. 3 is a flowchart illustrating an embodiment of process for determining a lower bound. In some embodiments, the process is used at step 204 in FIG. 2. At 300, it is determined if there is a known charge constraint or a bounded charge constraint. If there is a known charge constraint, then at 302, the lower bound is $m_k(t)=|C(t)-C_W|$. See, for example, Equation (9).

If there is a bounded charge constraint, then at 304, the lower bound is $m_b(t)=|C(t)+N|$ if $C(t)<-N$, $m_b(t)=0$ if $-N \leq C(t) \leq N$, or $m_b(t)=|C(t)-N|$ if $C(t)>N$. For example, although the exact charge of the written bit sequence ($C_w$) is not known in a bounded charge constraint system, the bound (N) is known:

$$-N \leq C_w \leq N. \quad (10)$$

Equation (9) can therefore be rewritten as:

$$e(t) \geq \min_{-N \leq c \leq N} |C(t)-c|. \quad (11)$$

Some observations enable Equation (11) to be modified into the form shown in step 304. First, when C(t) falls within the permitted range (i.e., $C(t) \in [-N, N]$), no bit errors can be detected because the charge from the read back bit sequence is plausible or permitted. The lower bound $m_b(t)$ can only be non-zero when C(t) is outside of the permitted range. So, when $C(t) \in [-N,N]$, $m_b(t)=0$.

Another observation is that C(t) is a monotonically increasing function as t increases (at least in this example where the relationship between voltage and bit values follows that shown in FIG. 1). As such, as t decreases, C(t) eventually becomes negative and for a negative C(t) less than $-N$, the value of c which minimizes $|C(t)-c|$ is $-N$. Conversely, as t increases, C(t) eventually becomes positive and for a positive C(t) greater than N, the value of c which minimizes $|C(t)-c|$ is N. Using these observations, Equation (11) may be rewritten as:

$$e(t) \geq m_b(t) = \begin{cases} |C(t)+N| & C(t) < -N \\ 0 & -N \leq C(t) \leq N \\ |C(t)-N| & C(t) > N. \end{cases} \quad (12)$$

This shows how the equation in step 304 may be obtained.

The following figure describes a known charge constraint embodiment.

Figure 4:
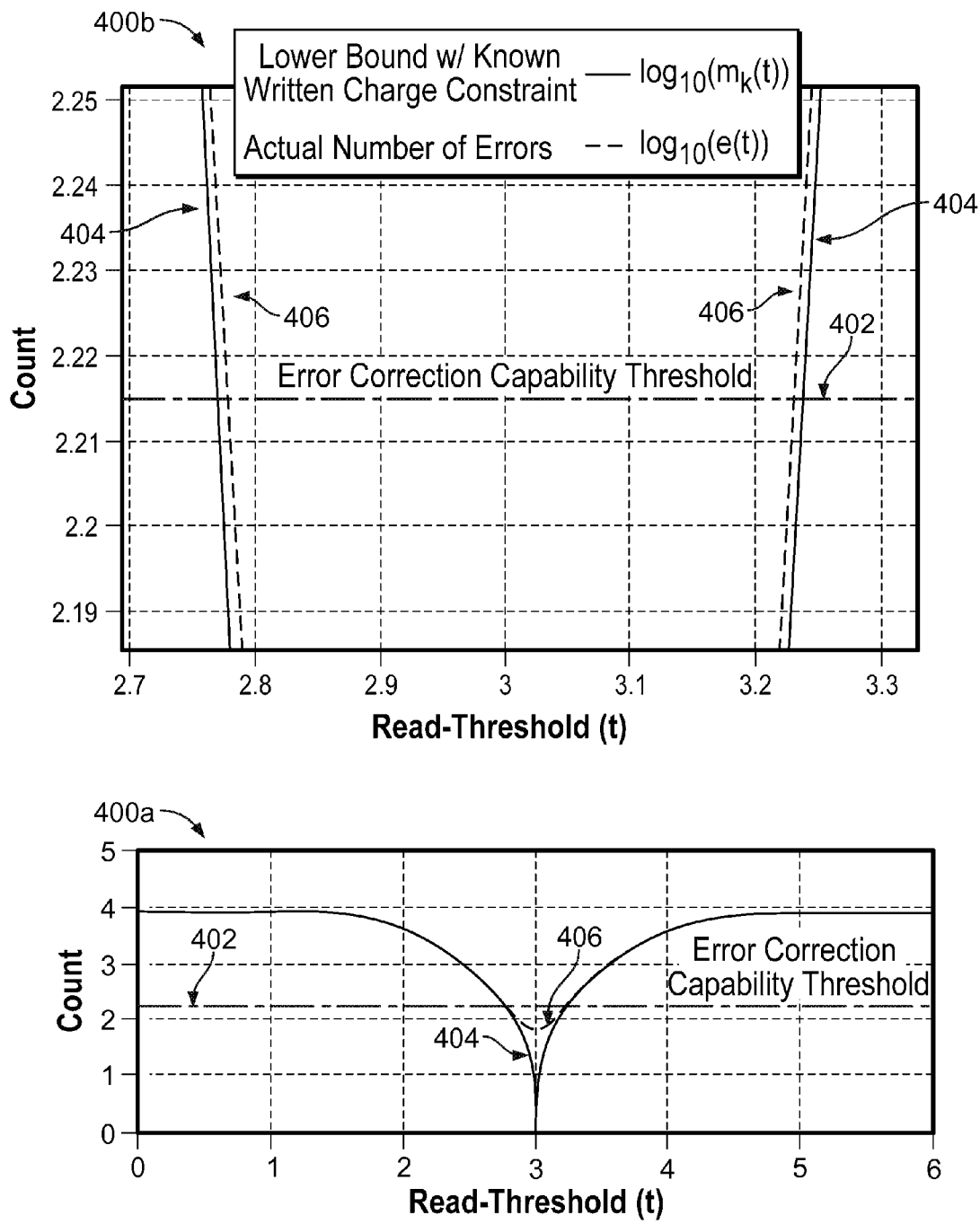
FIG. 4 is a diagram showing an embodiment of a graph of a lower bound when there is a known charge constraint.

FIG. 4 is a diagram showing an embodiment of a graph of a lower bound when there is a known charge constraint. In the example shown, there is a known charge constraint, for example because the charge of the written bit sequence is saved, or because a write processor is configured to output and store written bit sequences with the same or consistent charge. Graph 400a and graph 400b show the same information, where graph 400b shows a close up view of graph 400a.

In this example, the number of written 1s in the codeword is $N_1=8442$ and the number of written 0s in the codeword is $N_0=7942$. Since this is a known charge constraint example, the read processor knows that $C_W=(8442-7942)/2=250$. Also in this example, the threshold is 1% of the codeword, which for a codeword length of 16,384 bits corresponds to 164 bits in this example.

As the read threshold is swept from left to right in graphs 400a and 400b, the charge of the read back bit sequence changes since the number of 1s read back increases and the number of 0s read back decreases (at least in this example). Since this is a known charge constraint example, the lower bound is $m_k(t)=|C(t)-C_W|=|C(t)-250|$ from Equation (9) where C(t) varies with t.

For clarity, graphs 400a and 400b show the logarithm of the lower bound 404 (i.e., $\log_{10}(m_k(t))$), the logarithm of the actual number of bit errors 406 (i.e., $\log_{10}(e(t))$), and the logarithm of the error correction capability threshold 402 (i.e., $\log_{10}(164)$) since a logarithm shows the differences between the functions more clearly. When the lower bound is greater than the error correction capability threshold, an error correction decoder failure is predicted. In this particular example, an error correction decoding failure is predicted if t<2.7701V or t<3.2379V.

In this example, decoding is not initiated until a decision is made using the lower bound. So, if t<2.7701V or t>3.2379V, then decoding is not attempted. If an error correction decoding failure is not predicted (in this example, t ∈ [2.7701V, 3.2379V]) then error correction decoding is attempted.

As is shown in diagram 400b, the lower bound $m_k(t)$ is very close to the actual number of errors as the read threshold gets further away from the optimal read threshold (in this example, 3.0045V). The difference, in fact, between lower bound 404 and the actual number of errors 406 where they cross error correction capability threshold 402 is approximately 16 mV. In other words, a lower bound when there is a known written charge constraint is a relatively tight bound and there is very little loss in using $m_k(t)$ instead of e(t).

The following shows a bounded charge constraint embodiment.

Figure 5:
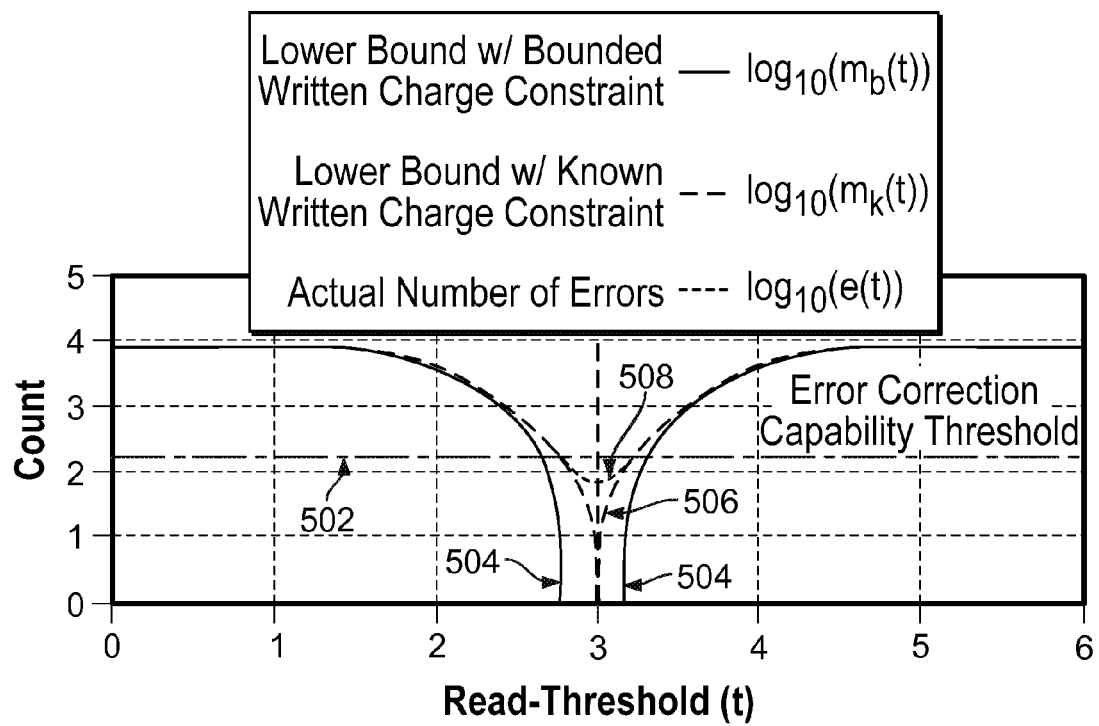
FIG. 5 is a diagram showing an embodiment of a graph of a lower bound when there is a bounded charge constraint.

FIG. 5 is a diagram showing an embodiment of a graph of a lower bound when there is a bounded charge constraint. In this example, $N_1=8224$, $N_0=8160$, and $C_W=(8224-8160)/2=32$. However, because this is a bounded charge constraint system, only the bound N=128 is known and it is not known that $C_W=32$. As in the previous figure, for clarity, logarithms are shown to more clearly show the differences between the different functions.

In this example, lower bound 504 is obtained using Equation (12). The error correction capability threshold is 1% of the bits in a codeword, which for 16,384 bits corresponds to an error correction capability threshold of 164 bits, shown as line 502. In this example, error correction decoding is attempted if the read threshold is between [2.6577V, 3.3053V] (i.e., $m_b(t)$ is less than the error correction capability threshold). If not, error correction decoding is not attempted. Naturally, in some other embodiments, error correction decoding may be initiated before a lower bound (e.g., $m_b(t)$ or $m_k(t)$) is calculated and if an error correction decoding failure is predicted, error correction decoding is terminated (e.g., earlier than normal and/or before a maximum number of decoding attempts is reached).

For comparison purposes, the corresponding lower bound (506) when the charge $C_W=32$ is known is also shown, as is the actual number of bit errors (508). Not surprisingly, the lower bound when there is a known charge constraint (506) has better performance and is closer to the actual number of bit errors (508) compared to the lower bound when there is a bounded charge constraint (504).

One type of charge constraint code is a running digital sum (RDS) constraint code. The following figures describe embodiments of systems which use a RDS constraint code.

Figure 6:
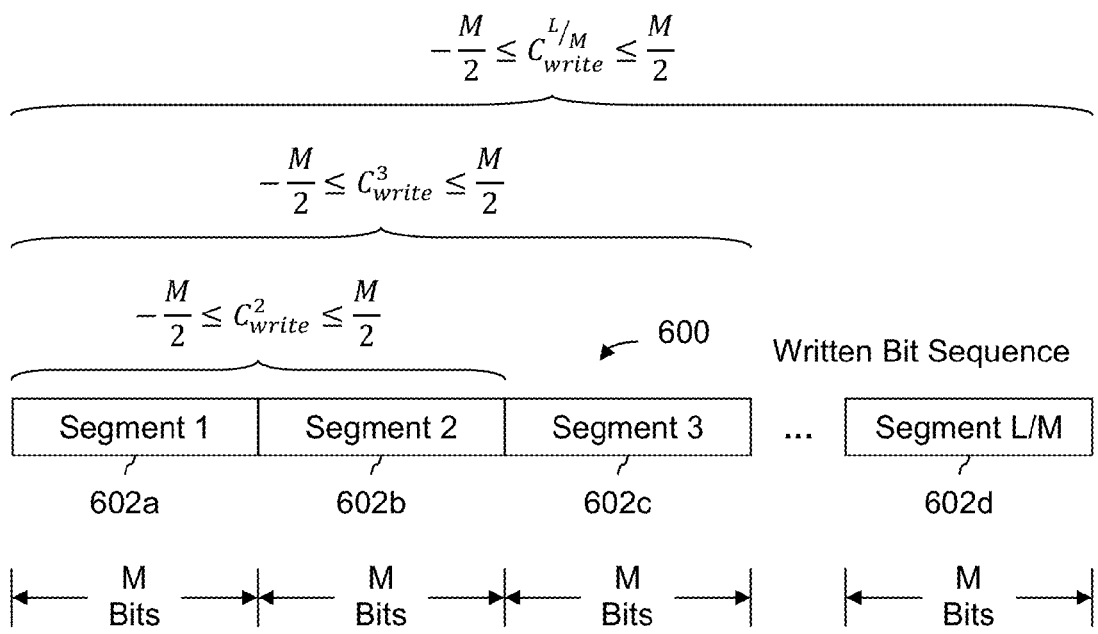
FIG. 6 is a diagram showing an embodiment of a written bit sequence to which an RDS constraint code is applied.

FIG. 6 is a diagram showing an embodiment of a written bit sequence to which an RDS constraint code is applied. In the example shown, a written bit sequence (600) is divided into segments, each of which is M bits long. For example, if the written bit sequence is 16,384 bits long (i.e., L=16,384) and M=256, then there are 64 segments, each of which is 256 bits long.

For the first through second segment (602a-602b), the RDS constraint code guarantees or enforces a constraint that the charge (i.e., $C_{write}^2$) is bounded by [−M/2, M/2]. In this example, since M=256, $C_{write}^2$ for segments 602a-602b is bounded by [−128, 128]. Similarly, the charge (i.e., $C_{write}^3$) for the first through third segments (602a-602c) is also guaranteed to be bounded by [−M/2, M/2]. For this example, that means that $C_{write}^3 \in [-128, 128]$. In general, an RDS constraint code guarantees that the charge $C_{write}^k$ corresponding to segments 1 through k (where k may be any of 2, 3, ..., L/M) will be between [−M/2, M/2].

As before, in some embodiments, the final or overall charge (i.e., $C^{L/M}$) of a RDS constrained written bit sequence may be known, or alternatively only the bound (i.e., M) may be known. Systems which fall into the former category are referred to as known RDS charge constraint systems and systems which fall into the latter category are referred to as bounded RDS charge constraint systems.

The following figure describes a bounded RDS charge constraint embodiment.

Figure 7:
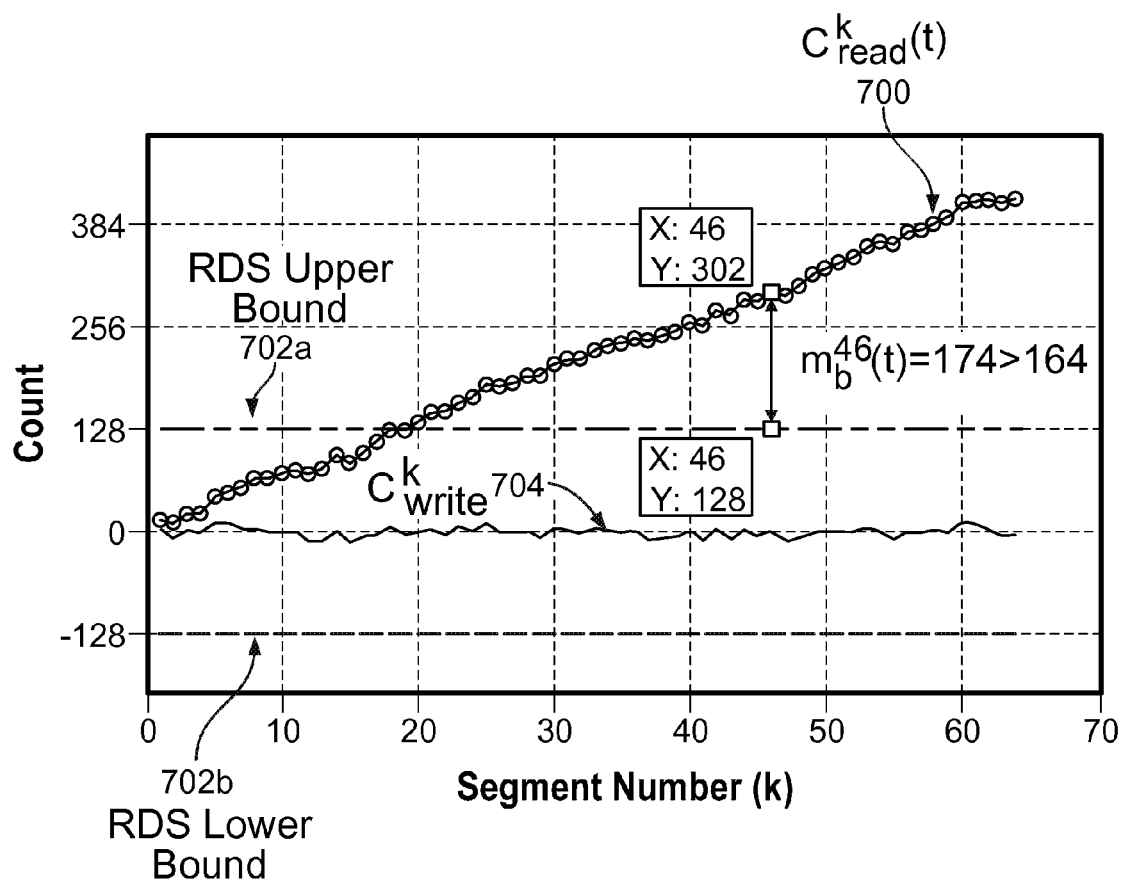
FIG. 7 is a diagram showing an embodiment of a graph of a lower bound when there is a bounded RDS charge constraint.

FIG. 7 is a diagram showing an embodiment of a graph of a lower bound when there is a bounded RDS charge constraint. In the example shown, L=16,384 and M=256. As such, there are 64 segments and the x-axis of the graph shown corresponds to segment number. In the graph shown, function 704 is the charge (i.e., $C_{write}^k$) of the written bit sequence which varies with segment number, function 700 is the charge (i.e., $C_{read}^k(t)$) of the read back bit sequence which varies with segment number, line 702a is the RDS upper bound (in this example, the upper RDS bound is M/2=128), and line 702b is the RDS lower bound (in this example, the lower RDS bound is −M/2=−128). Unlike FIGS. 4 and 5, a range of read thresholds is not "swept." In this example, all data points in read charge function 700 corresponds to the same read threshold, in this case t=3.4V.

In some embodiments, the process of FIG. 3 is used to obtain a lower bound in a bounded RDS charge constraint system. For bounded RDS charge constraint systems, the process of FIG. 3 passes through step 304. In Equation (12), the general bound (i.e., N) may be replaced with the RDS bound (i.e., M/2):

$$e^k(t) \geq m_b^k(t) = \begin{cases} \left| C_{read}^k(t) + \dfrac{M}{2} \right| & C_{read}^k(t) < -\dfrac{M}{2} \\ 0 & -\dfrac{M}{2} \leq C_{read}^k(t) \leq \dfrac{M}{2} \\ \left| C_{read}^k(t) - \dfrac{M}{2} \right| & C_{read}^k(t) > \dfrac{M}{2}. \end{cases} \quad (13)$$

In the example of FIG. 7:

$$e^k(t) \geq m_b^k(t) = \begin{cases} 0 & 0 \leq C_{read}^k(t) \leq 128 \\ |C_{read}^k(t) - 128| & C_{read}^k(t) > 128. \end{cases} \quad (14)$$

Note that FIG. 7 does not show negative values of $C_{read}^k(t)$ so Equation (14) does not have a lower bound for $C_{read}^k(t)<0$. This does not necessarily mean that a lower bound does not exist for those values of $C_{read}^k(t)$, it is just not shown.

At the 46th segment, $m_b^{46}(t)=302-128=174$. As in the previous example, the error correction capability threshold is set to be 1% of the bits, which corresponds to 164 bits. Since $m_b^{46}(t)=174>164$, an error correction decoding failure is predicted after the 46th segment.

In this example, in response to the error correction decoding failure predicted after the 46th segment, the system cancels or aborts transfer of the remaining 18 segments. For example, failure was predicted after the 46th segment, so transfer of the 47th through 64th segments is canceled. In some embodiments, the transfer which is canceled is across an I/O bus between storage media (e.g., on a first semiconductor device) and a storage controller (e.g., on a second semiconductor device). Canceling the transfer of the 47th-64th segments conserves power.

In some embodiments, in response to the error correction decoding failure predicted after the 46th segment, an error correction decoder is not initiated. That is, error correction decoding is delayed until error correction decoding prediction has completed without any predictions of failure. In some embodiments, error correction decoding begins as soon as data is received, and an error correction decoder is terminated (e.g., early and/or before a maximum number of decoding attempts is reached).

Compared to general bounded charge constraint systems (one example of which is shown in FIG. 5), in bounded RDS charge constraint systems, it is possible to predict an error correction decoding failure even before all of the bits in a codeword have been received. Typically, the charge of the read back bit sequence, $C_{read}^k(t)$, while not exactly a monotonically increasing or decreasing function of the segment number, exhibits a general upward or downward trend as the segment number increases. For example, in FIG. 7, the charge of the read back bit sequence exhibits an upward trend as the segment number increases. Therefore, once the lower bound for a certain length of the read back bit sequence exceeds the error correction capability threshold, it is safe to conclude that the lower bound for the entire read back bit sequence will also exceed the threshold. As such, it is possible to predict an error correction decoding failure without processing the entire read back bit sequence.

Returning to FIG. 2, it is noted that the process of FIG. 2 applies to known RDS charge constraint systems and bounded RDS charge constraint systems. For example, in such systems, the process of FIG. 2 is repeatedly performed. The first time, the process is performed on the first and second segments in a read back bit sequence. The check at 208 when performed for the first time, for example, determines whether the lower bound (calculated using the first through second segments) is greater than or equal to the threshold. The second time, the process is performed on the first through third segments in a read back bit sequence. The check at 208 the second time determines whether the lower bound (calculated using the first through third segments) is greater than or equal to the threshold.

The following figure describes an embodiment of a known RDS charge constraint system.

Figure 8:
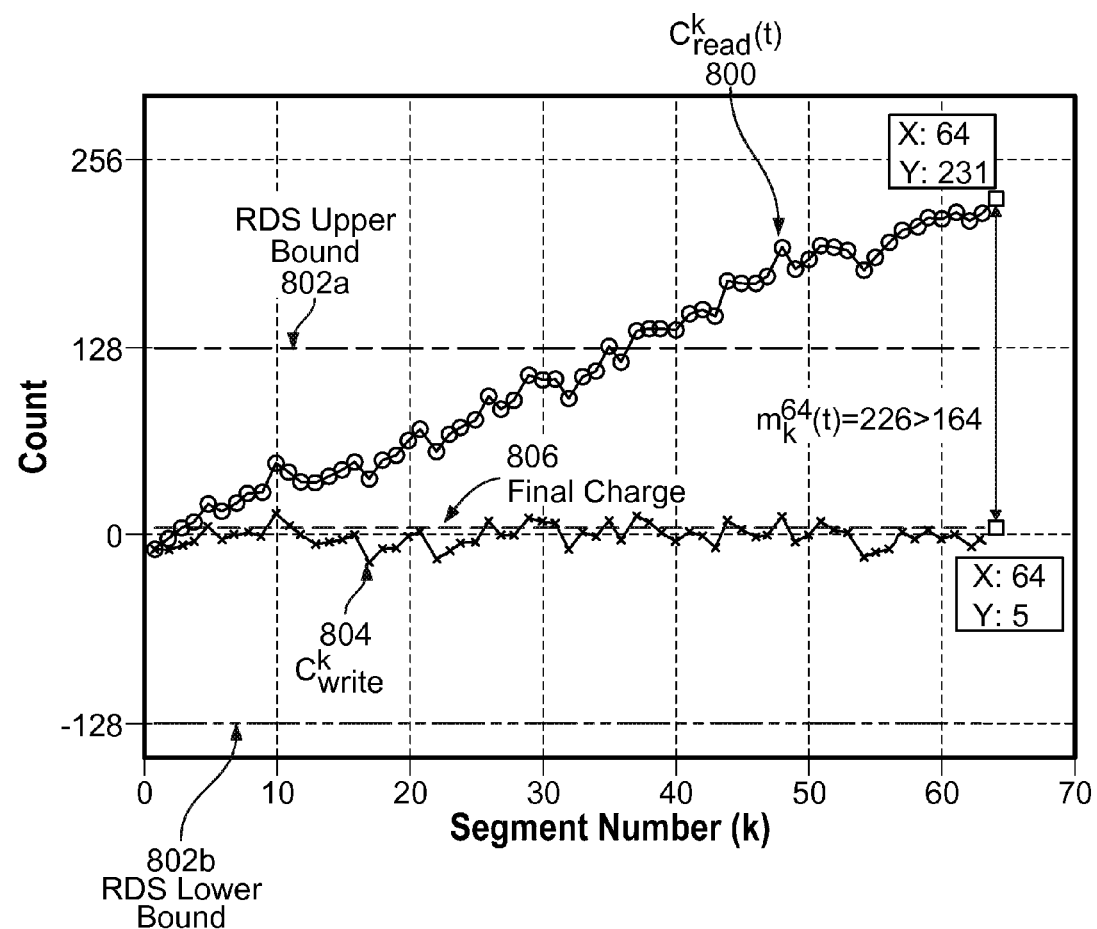
FIG. 8 is a diagram showing an embodiment of a graph of a lower bound when there is a known RDS charge constraint.

FIG. 8 is a diagram showing an embodiment of a graph of a lower bound when there is a known RDS charge constraint. In this example, lines 802a and 802b are the RDS upper bound and RDS lower bound, respectively. Function 800 is the charge associated with the read back sequence and varies with segment number. Function 804 is the charge associated with the written bit sequence and also varies based on segment number. Line 806 shows the final or overall charge of the written bit sequence. As in the previous example, the graph shows values for a fixed or given read threshold value; the exemplary graph shown does not correspond to a sweep of read threshold values.

In this example, there are two ways to predict an error correction decoding failure. First, since the bound is known, the process described above with respect to FIG. 7 may be used to check for an error correction decoding failure after each segment. For example, the first time the process of FIG. 2 is performed, a lower bound (i.e., $m_k^2(t)$) calculated using the first through second segments is used; the second time the process of FIG. 2 is performed, a lower bound (i.e., $m_k^3(t)$) calculated using the first through third segments is used; and so on.

The second way an error correction decoding failure can be predicted in a known RDS charge constraint system is when the entire read back bit sequence is received and the known RDS charge constraint can be used. In FIG. 8, for example, the final or overall charge of the written bit sequence is 5 and is shown as line 806. After the $64^{th}$ (i.e., last) segment has been received, the lower bound (i.e., $m_k^{64}(t)$) which is calculated using the known RDS charge constraint may be calculated from Equation (9): $m_k^{64}(t)=C_{read}^{64}(t)-C_W=231-5=226$. This lower bound is greater than the error correction capability threshold of 164, so an error correction decoding failure is predicted. Naturally, a decoding failure may already have been predicted before the last segment using the technique based on the RDS bound.

Figure 9:
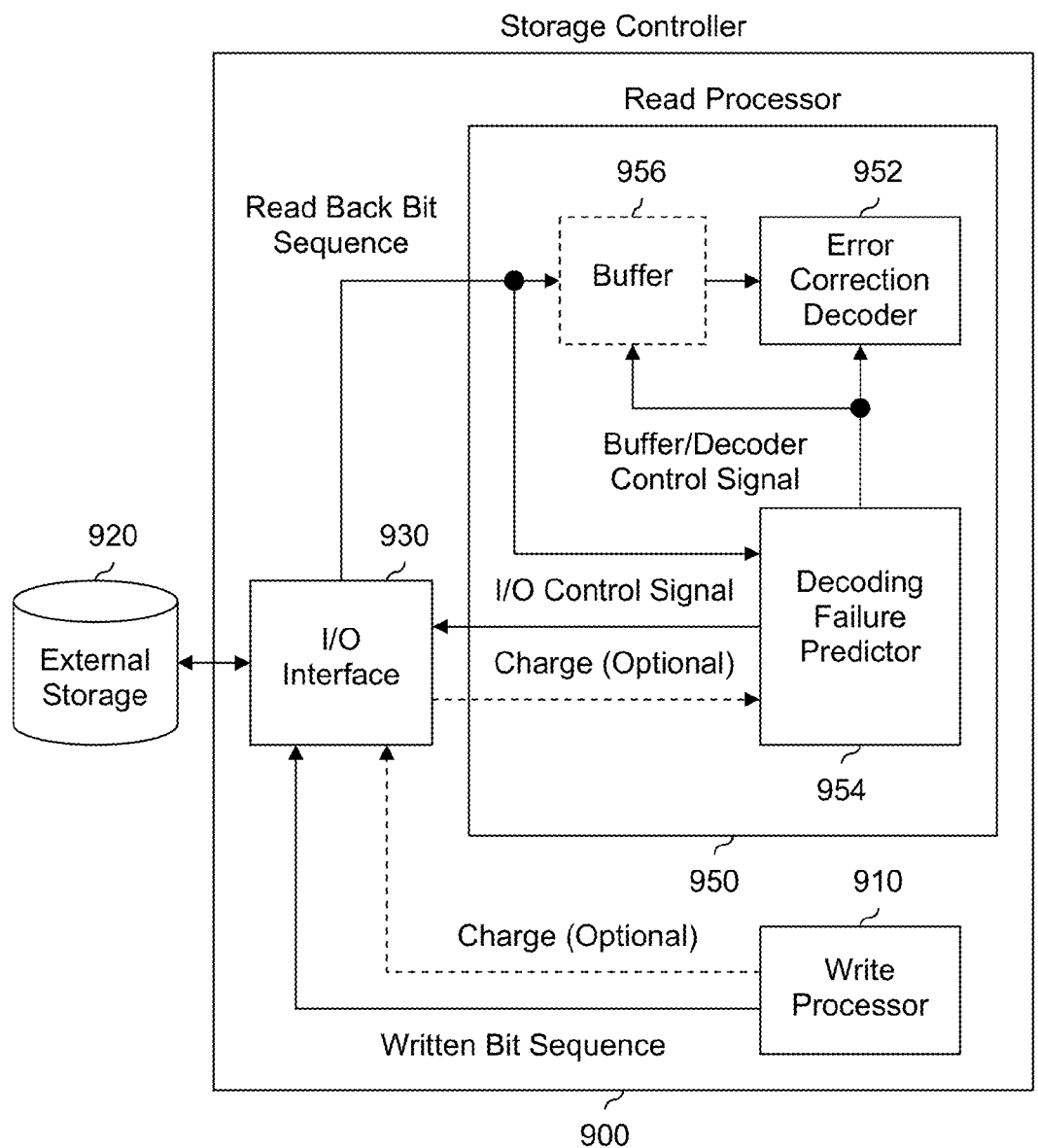
FIG. 9 is a diagram showing an embodiment of a storage controller which uses a lower bound to predict error correction decoding failures and configured components accordingly in order to save power.

FIG. 9 is a diagram showing an embodiment of a storage controller which uses a lower bound to predict error correction decoding failures and configured components accordingly in order to save power. In the example shown, storage controller 900 is a first semiconductor device and external storage 920 (e.g., NAND Flash storage) is a second semiconductor device. Storage controller 900 includes write processor 910 which outputs a written bit sequence. The written bit sequence output by write processor 910 is charge constrained, for example RDS charge constrained in some embodiments. In known (e.g., RDS) charge constraint systems, the final or overall charge is stored in external storage 920. Alternatively, if the system is a bounded (e.g., RDS) charge constraint system, then the final or overall charge is not stored. The written bit sequence and the optional final charge are passed from write processor 910 to I/O interface 930. Using I/O interface 930, the written bit sequence, along with the optional final charge, are written to external storage 920.

When the stored data is desired, I/O interface 930 is instructed to access external storage 920 in order to obtain a read back bit sequence. In some embodiments, the read back bit sequence is returned in "chunks". For example, if a codeword is 4,096 bits long but the bus between I/O interface 930 and external storage 920 is 2,048 bits wide, then two transfers are required for a single codeword. In some RDS charge constrained embodiments, one or more segments (e.g., each of length M) are obtained by I/O interface 930.

The read back bit sequence is passed to error correction decoder 952 and decoding failure predictor 954 in read processor 950. In some embodiments, error correction decoder 952 (e.g., an LDPC decoder) begins decoding as soon as data is received. In some other embodiments, error correction decoder 952 waits for an instruction from decoding failure predictor 954 to begin processing. In such embodiments, buffer 956 in front of error correction decoder 952 stores data until an instruction is received from decoding failure predictor 954 to either discard the stored data or begin decoding.

Decoding failure predictor 954 uses the read back bit sequence to obtain one or more lower bounds and uses those lower bound(s) to predict (if appropriate) if error correction decoder 952 will fail. In this example, if the system is a known (e.g., RDS) charge constraint system, the final or overall charge corresponding to the read back bit sequence is retrieved from external storage 920 and is used in generating a lower bound.

Depending on the prediction and how the system is configured, decoding failure predictor 954 outputs a variety of decoder control signals to error correction decoder 954. In systems where error correction decoder 952 begins processing as soon as data is received, a decoding termination signal is sent to error correction decoder 952. If failure is not predicted, then the ongoing decoding is permitted to continue and is not interrupted. In embodiments where error correction decoder 952 waits for instructions from decoding failure predictor 954 before beginning decoding, a discard instruction may be sent to buffer 956 to discard the stored data (which has a high probability of failing). If no failure is predicted then an instruction to begin decoding is sent to buffer 956 and error correction decoder 952.

In some (e.g., known or bounded) RDS charge constraint embodiments, decoding failure predictor 954 sends an I/O control signal to I/O interface 930 depending upon the results of the failure prediction and/or how the system is configured. For example, in some embodiments, I/O interface 930 does not retrieve a next segment until so instructed by decoding failure predictor 954. In such embodiments, after each check with each new segment, I/O interface 930 is instructed by decoding failure predictor 954 to retrieve the next segment if a decoding failure is not predicted (at least so far). In some embodiments, unless instructed otherwise, I/O interface 930 retrieves data from external storage 920. In some such embodiments, a "cancel read" signal may be sent to I/O interface 930 and if any transfers or accesses associated with the predicted failure are still pending then those transfers or accesses are canceled.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
    an I/O interface configured to read, from storage, a bit sequence in order to obtain a read back bit sequence;
    a buffer configured to receive the read back bit sequence from the I/O interface and pass the read back bit sequence to an error correction decoder;

the error correction decoder configured to perform error correction decoding on the read back bit sequence; and
a decoding failure predictor configured to:
   determine a lower bound on a number of bit errors associated with the read back bit sequence based at least in part on (1) the charge of the read back bit sequence, wherein the charge of a given bit sequence is associated with a difference between the number of 1s and the number of 0s in the given bit sequence, and (2) charge constraint information that includes one or more charges associated with a written bit sequence that corresponds to the read back bit sequence;
   compare the lower bound against an error correction capability threshold associated with an error correction decoder; and
   in the event the lower bound is greater than or equal to the error correction capability threshold, perform one or more of the following:
      instruct the error correction decoder to terminate error correction decoding which has already begun on the read back bit sequence;
      instruct the buffer to discard the read back bit sequence, wherein the error correction decoder has not started processing the read back bit sequence; or
      instruct the I/O interface to cancel a read of a segment that is associated with the read back bit sequence.

2. The system of claim 1, wherein the error correction decoder includes one or more of the following: an iterative error correction decoder or a low-density parity check (LDPC) decoder.

3. The system of claim 1, wherein the system includes a semiconductor device, including one or more of the following: a field-programmable gate array (FPGA) or an application-specific integrated circuit (ASIC).

4. The system of claim 1, wherein the storage from which the read back bit sequence is read includes one or more of the following: solid state storage or NAND Flash storage.

5. The system of claim 1, wherein the charge constraint information is associated with a running digital sum (RDS).

6. The system of claim 1, wherein:
the system further includes a write processor that is configured to store, for each written bit sequence, a charge; and
the decoding failure predictor is further configured to obtain a stored charge for a written bit sequence that corresponds to the read back bit sequence, wherein the charge constraint information includes the stored charge and the stored charge is used to determine the lower bound.

7. The system of claim 6, wherein:
t is a read threshold used to read the read back bit sequence from the storage;
the lower bound includes a lower bound at the read threshold t (m(t))
the charge of the read back bit sequence includes a charge of the read back bit sequence at the read threshold t (C(t)); and
the decoding failure predictor is configured to determine the lower bound at the read threshold t, including by using m (t)=|C(t)−$C_w$|, wherein $C_w$ is the stored charge.

8. The system of claim 1, wherein:
the system further includes a write processor that is configured to generate all written bit sequences with a charge that is bounded by a bound;
the charge constraint information includes the bound; and
the decoding failure predictor is configured to determine the lower bound, including by using the bound.

9. The system of claim 8, wherein:
t is a read threshold used to read the read back bit sequence from the storage;
the lower bound includes a lower bound at the read threshold t (m(t));
the charge of the read back bit sequence includes a charge of the read back bit sequence at the read threshold t (C(t)); and
the decoding failure predictor is configured to determine the lower bound at the read threshold t, including by using $$m_b(t) = \begin{cases} |C(t)+N| & C(t) < -N \\ 0 & -N \le C(t) \le N \\ |C(t)-N| & C(t) > N, \end{cases}$$

where N is the bound.

10. A method, comprising:
using an I/O interface to read, from storage, a bit sequence in order to obtain a read back bit sequence;
receiving, at a buffer, the read back bit sequence from the I/O interface;
passing the read back bit sequence from the I/O interface to an error correction decoder;
performing, at the error correction decoder, error correction decoding on the read back bit sequence; and
using a processor to determine a lower bound on a number of bit errors associated with the read back bit sequence based at least in part on (1) the charge of the read back bit sequence, wherein the charge of a given bit sequence is associated with a difference between the number of 1s and the number of 0s in the given bit sequence, and (2) charge constraint information that includes one or more charges associated with a written bit sequence that corresponds to the read back bit sequence;
using the processor to compare the lower bound against an error correction capability threshold associated with an error correction decoder; and
in the event the lower bound is greater than or equal to the error correction capability threshold, performing one or more of the following:
   instruct the error correction decoder to terminate error correction decoding which has already begun on the read back bit sequence;
   instruct the buffer to discard the read back bit sequence, wherein the error correction decoder has not started processing the read back bit sequence; or
   instruct the I/O interface to cancel a read of a segment that is associated with the read back bit sequence.

11. The method of claim 10, wherein the error correction decoder includes one or more of the following: an iterative error correction decoder or a low-density parity check (LDPC) decoder.

12. The method of claim 10 further including:
storing, for each written bit sequence, a charge; and
obtaining a stored charge for a written bit sequence that corresponds to the read back bit sequence, wherein the charge constraint information includes the stored charge and the stored charge is used to determine the lower bound.

13. The method of claim 12, wherein:
t is a read threshold used to read the read back bit sequence from the storage;
the lower bound includes a lower bound at the read threshold t (m(t))
the charge of the read back bit sequence includes a charge of the read back bit sequence at the read threshold t (C(t)); and
using the processor to determine the lower bound at the read threshold t includes using m (t)=|C(t)−$C_w$|, wherein $C_w$ is the stored charge.

14. The method of claim 10, wherein:
the method further includes generating all written bit sequences with a charge that is bounded by a bound;
the charge constraint information includes the bound; and
using the processor to determine the lower bound includes using the bound.

15. The method of claim 14, wherein:
t is a read threshold used to read the read back bit sequence from the storage;
the lower bound includes a lower bound at the read threshold t (m(t));
the charge of the read back bit sequence includes a charge of the read back bit sequence at the read threshold t (C(t)); and
using the processor to determine the lower bound at the read threshold t includes using $$m_b(t) = \begin{cases} |C(t)+N| & C(t) < -N \\ 0 & -N \le C(t) \le N \\ |C(t)-N| & C(t) > N, \end{cases}$$

where N is the bound.

16. A computer program product, the computer program product being embodied in a non-transitory computer readable storage medium and comprising computer instructions for:
using an I/O interface to read, from storage, a bit sequence in order to obtain a read back bit sequence;
receiving, at a buffer, the read back bit sequence from the I/O interface;
passing the read back bit sequence from the I/O interface to an error correction decoder;
performing, at the error correction decoder, error correction decoding on the read back bit sequence; and
determining a lower bound on a number of bit errors associated with the read back bit sequence based at least in part on (1) the charge of the read back bit sequence, wherein the charge of a given bit sequence is associated with a difference between the number of 1s and the number of 0s in the given bit sequence, and (2) charge constraint information that includes one or more charges associated with a written bit sequence that corresponds to the read back bit sequence;
comparing the lower bound against an error correction capability threshold associated with an error correction decoder; and
in the event the lower bound is greater than or equal to the error correction capability threshold, performing one or more of the following:
instruct the error correction decoder to terminate error correction decoding which has already begun on the read back bit sequence;
instruct the buffer to discard the read back bit sequence, wherein the error correction decoder has not started processing the read back bit sequence; or
instruct the I/O interface to cancel a read of a segment that is associated with the read back bit sequence.

17. The computer program product of claim 16 further including computer instructions for:
storing, for each written bit sequence, a charge; and
obtaining a stored charge for a written bit sequence that corresponds to the read back bit sequence, wherein the charge constraint information includes the stored charge and the stored charge is used to determine the lower bound.

18. The computer program product of claim 17, wherein:
t is a read threshold used to read the read back bit sequence from the storage;
the lower bound includes a lower bound at the read threshold t (m(t))
the charge of the read back bit sequence includes a charge of the read back bit sequence at the read threshold t (C(t)); and
determining the lower bound at the read threshold t includes using m (t)=|C(t)−$C_w$|, wherein $C_w$ is the stored charge.

19. The computer program product of claim 16, wherein:
the method further includes generating all written bit sequences with a charge that is bounded by a bound;
the charge constraint information includes the bound; and
determining the lower bound includes using the bound.

20. The computer program product of claim 19, wherein:
t is a read threshold used to read the read back bit sequence from the storage;
the lower bound includes a lower bound at the read threshold t (m(t));
the charge of the read back bit sequence includes a charge of the read back bit sequence at the read threshold t (C(t)); and
determining the lower bound at the read threshold t includes using $$m_b(t) = \begin{cases} |C(t)+N| & C(t) < -N \\ 0 & -N \le C(t) \le N \\ |C(t)-N| & C(t) > N, \end{cases}$$

where N is the bound.

* * * * *